United States Patent [19]

Nativi

[11] 4,415,604

[45] Nov. 15, 1983

[54] CONFORMAL COATING AND POTTING SYSTEM

[75] Inventor: Larry A. Nativi, Rocky Hill, Conn.

[73] Assignee: Loctite Corporation, Newington, Conn.

[21] Appl. No.: 441,164

[22] Filed: Nov. 12, 1982

[51] Int. Cl.³ ............................................. B05D 3/06
[52] U.S. Cl. .............................. 427/54.1; 204/159.15; 204/159.19; 427/44; 525/455
[58] Field of Search ................... 427/54.1, 44; 204/159.16, 159.19, 159.15; 525/455

[56] References Cited

U.S. PATENT DOCUMENTS

| | | | |
|---|---|---|---|
| 3,437,514 | 4/1969 | Burlant . | |
| 3,650,669 | 3/1972 | Osborn et al. | 204/159.19 |
| 3,652,333 | 3/1972 | Warren . | |
| 3,959,521 | 5/1976 | Suetsugi et al. | 427/44 |
| 3,979,426 | 9/1976 | Demajistre | 260/404.5 |
| 3,989,609 | 11/1976 | Brack | 204/159.19 |
| 4,013,806 | 3/1977 | Volkert | 427/54 |
| 4,017,649 | 4/1977 | DeMajistre | 427/44 |
| 4,025,407 | 4/1977 | Chang et al. | 204/159.14 |
| 4,082,634 | 4/1978 | Chang | 204/159.15 |
| 4,086,373 | 4/1978 | Tobias et al. | 427/44 |
| 4,091,122 | 5/1978 | David et al. | 427/44 |
| 4,122,225 | 10/1978 | Holmstrom et al. | 428/172 |
| 4,128,600 | 12/1978 | Skinner et al. | 260/859 |
| 4,137,084 | 1/1979 | Davis et al. | 102/21 |
| 4,138,299 | 2/1979 | Bolgiano | 204/159.16 |
| 4,161,556 | 4/1979 | Lenard et al. | 427/385 A |
| 4,173,682 | 11/1979 | Noomen et al. | 204/159.19 |
| 4,176,212 | 11/1979 | Brack | 204/159.19 |
| 4,199,421 | 4/1980 | Kamada et al. | 204/159.22 |
| 4,203,792 | 5/1980 | Thompson | 156/272 |
| 4,204,010 | 5/1980 | Kramm et al. | 427/44 |
| 4,208,005 | 6/1980 | Nate et al. | 228/175 |
| 4,212,901 | 7/1980 | van Neerbos et al. | 427/53.1 |
| 4,247,578 | 1/1981 | Skinner | 427/44 |

OTHER PUBLICATIONS

Clyde F. Coombs, Jr., Printed Circuit Handbook, 1979 Second Edition, pp. 12-1 to 12-9.

*Primary Examiner*—John H. Newsome
*Attorney, Agent, or Firm*—Hayes, Davis & Soloway

[57] ABSTRACT

Ultraviolet curable polymerizable coating system having a built-in secondary curing mechanism is disclosed. The polymerizable coating system is a one component system comprising at least one isocyanate-capped polyether diol and triol, an acrylate or methacrylate reactive diluent, and a polymerization initiator of the photoinitiator type. The coating system is also moisture curable.

18 Claims, No Drawings

CONFORMAL COATING AND POTTING SYSTEM

This invention concerns polymerizable compositions which have their primary utility in the area of coatings and sealants. The invention has particular utility in the area of conformal coatings for printed circuit boards and pottings for electrical and electronic components and will be described in connection with such utility, although other uses are contemplated.

Printed circuit boards and electrical and electronic components may be coated or potted with a protective film to avoid or at least minimize degradation in electrical performance due to contamination. The most damaging, and usually the most prevalent contaminant generally is considered to be moisture or humidity. Excessive moisture or humidity will drastically lower insulation resistance between conductors, accelerate high-voltage breakdown and dendritic growth, and corrode conductors. Other contaminants which may damage printed circuit boards and components include various chemicals which may be residues of the manufacturing process such as fluxes, organic solvents, release agents, metal particles and marking inks, and contaminants which inadvertently may be deposited by human handling such as body greases, fingerprints, cosmetics and food stains. Ambient operating conditions may also contribute a variety of contaminants such as salt spray, dirt and dust, oil, fuel, acid, corrosive vapor and fungus. Although the list of possible contaminants is almost endless, in all but the most severe cases, their destructive action effectively can be eliminated by provision of a good conformal coating.

In addition to providing protection from contaminants, conformal coatings and pottings also provide a certain degree of protection to mechanical shock, vibration and tampering.

Various conformal coating and potting systems are known in the art and are available commercially. Each has its advantages and disadvantages. One such prior art conformal coating and potting system is based on acrylics. Acrylics make excellent coating and potting systems from a production standpoint because they readily may be applied by spraying, dipping or brushing. Acrylic coatings and pottings have desirable electrical and physical properties and are fungus resistant. Additional advantages of acrylic coatings and pottings include long life, low or no exotherm during cure, and little or no shrinkage during cure. However, acrylic coatings and pottings typically are formed by solvent evaporation and reach optimum physical characteristics during cure typically in a matter of minutes. Conventional acrylic coatings and pottings are soluble in chlorinated solvents such as tricholorethane or methylene chloride.

Another prior art conformal coating and potting system is based on polyurethanes. Polyurethanes are available as either single or two-component systems. Polyurethane coatings and pottings offer excellent humidity and chemical resistance and good dielectric properties. Single-component urethanes are relatively easy to apply and exhibit relatively long working pot life. However, single-component polyurethanes typically require a curing time of three to ten days at room temperature to reach optimum physical characteristics. Two-component polyurethanes typically achieve optimum cure at elevated temperatures within one to three hours, but exhibit relatively short working pot life.

Also, surface preparation of substrate boards and components prior to application of polyurethane based coatings and pottings is important, since even minute quantities of moisture on a substrate board or component could produce blistering under humid conditions. Blisters, in turn, may lead to electrical failures and mandate costly rework. Polyurethane coatings and pottings are insoluble in most common solvents, which is a drawback to rework. Thus, repair of a polyurethane coated board or potted components requires a corrosive stripper to remove effectively all traces of the polyurethane film. However, extreme caution must be exercised when such a stripper is used, because the stripper also may corrode metallic surfaces on the board or component.

Epoxy resin systems also have been employed by the prior art for conformal coatings and pottings. Epoxy resins are available as two component systems only. Epoxy resin coatings and pottings provide good humidity resistance and high abrasive and chemical resistance. However, epoxy resins are virtually impossible to remove chemically for rework because any stripper that will attack the coating also will attack materials commonly used in making the electronic components and the epoxy-glass of printed circuit boards as well. Thus, the only effective way to repair an epoxy resin coated board or potted component is to burn through the epoxy coating with a hot knife or soldering iron. However, burning introduces a cosmetic defect which is unacceptable to many consumers. Moreover, epoxy resins shrink somewhat during cure. Accordingly, a buffer material must be placed around fragile electronic components to prevent fracturing from shrinkage. Curing of epoxy systems can be accomplished in one to three hours at elevated temperature, or four to seven days at room temperature. Epoxy resins exhibit a relatively short working pot life which is an additional disadvantage.

Silicone resins also have been employed by the prior art for conformal coating and pottings. Silicone resin coatings and pottings provide high humidity and corrosion resistance along with high temperature resistance which makes silicone resins preferred for coating and potting assemblies that contain high heat-dissipating components such as power resistors. However, silicone resins are relatively thick making them somewhat difficult to apply. Moreover, silicone resins require a relatively long cure, and repairability is difficult since silicone resins once cured are essentially insoluble, and cannot be vaporized with the heat of a soldering iron. Accordingly, the only effective way to repair a silicone resin coated circuit board or potted component is to mechanically remove the coating.

The prior art also has employed polyimides for conformal coatings and pottings. Polyimide coatings and pottings provide high-temperature, moisture and chemical resistance over extended periods of time. However, polyimide coatings require high temperature cure (one to three hours at 200° to 250° C.) which could damage heat sensitive electronic components, and this requirement severely limits the use of polyimide coating systems. Also, since polyimides are high-temperature, moisture and chemical resistant, the only effective way to repair a polyimide coated board or potted component is to mechanically remove the coating.

Diallyl phthalate varnishes also have been proposed by the prior art for conformal coatings and pottings, and provide excellent high temperature and chemical resistance. However, diallyl phthalate varnishes require high temperature cure (approximately 150° C.) which severely limits their use. And, diallyl phthalate coatings and pottings also typically must be mechanically removed to permit repair.

The preceding discussion of background in the art of conformal coating circuit boards is taken largely from *Printed Circuits Handbook*, Clyde F. Coombs, Jr., Editor, McGraw Hill Book Company, Second Edition (1979).

As thus is apparent from the above discussion, none of the currently available conformal coatings and pottings are completely satisfactory since all prior art conformal coatings and pottings at best are a tradeoff of preferred application characteristics (i.e., processing speed, ease of application, pot life and cure conditions), preferred physical characteristics, (i.e., electrical properties, temperature, chemical and moisture resistance), and repairability.

It is thus a primary object of the present invention to provide an improved conformal coating and potting system, i.e. method and materials which overcomes the aforesaid and other disadvantages of the prior art.

Other objects of the present invention are to provide an improved composition for conformal coating printed circuit board assemblies and potting electrical and electronic components which compositions demonstrate extended pot life and ease of application, rapid dry-to-touch cure, good electrical properties, superior adhesion and abrasion resistance, excellent high temperature, chemical and moisture resistance, and ease of repairability. Yet other objects will in part appear obvious and will in part appear hereafter.

The invention accordingly comprises the process involving the several steps and relative order of one or more such steps with respect to each other, and the devices, materials and compositions possessing the features, properties and relations of elements which are exemplified in the following disclosure and scope of application of which will be indicated in the claims.

SUMMARY OF THE INVENTION

Generally, the foregoing and other objects of the invention are achieved by the provision of an ultraviolet (hereinafter "uv") curable polymerizable coating and potting system having a secondary cross-linking curing mechanism built in. More specifically, in accordance with the invention the polymerizable system is a one component coating system comprising (1) an isocyanate-capped preopolymer formed by reacting a blend of one or more polyether diols and one or more polyether triols with an excess of a diisocyanate, (2) a mono or polyfunctional acrylate or methacrylate reactive diluent, and (3) a polymerization initiator of the photoinitiator type. A particular feature and advantage of the instant invention is that the uv radiation cure produces extremely rapid dry-to-the-touch cure of all exposed areas of the coating or potting thereby permitting substantially immediate handling of the coated products and maintainance of the shape of the coating which might otherwise sag and creep, while secondary curing which occurs by moisture reaction of the isocyanate capped prepolymer provides substantially complete cure of unexposed (shadow) areas of the coating or potting under conditions of ambient temperature and humidity.

For a fuller understanding of the nature and objects of the present invention, reference should be made to the following detailed description of the invention taken in connection with the accompanying examples.

The terms "liquid", and "solid" or "dry-to-the-touch" are used herein with reference to physical properties of the materials, are to be understood as to be referring to such properties as they exist under conditions as may be specified. For example, the term "liquid" refers to a physical state wherein a material is readily flowable while the terms "solid" and "dry-to-the-touch" are to be understood as referring respectively to physical states wherein a material is resistant to change in shape and is without free surface moisture or surface tackiness.

DETAILED DESCRIPTION OF THE INVENTION AND ITS PREFERRED EMBODIMENTS

The isocyanate-capped prepolymers employed in the coating system of the instant invention are formed by reacting a blend of one or more polyether diols and one or more polyether triols with an excess of at least one diisocyanate. The preferred polyether diols are selected from those having a molecular weight in the range of about 300 to about 5000, while the preferred polyether triols are selected from those having a molecular weight in the range of about 200 to about 3000. Particularly preferred is a blend of polyether diols having a molecular weight of about 400 to about 1000, and polyester triols having a molecular weight of about 700.

The polyether diol/polyether triol blend typically comprises the polyether diol in substantial major proportion, e.g. seventy or more by weight of the polyether diol, while the polyether triol may be present in quite minor amount, e.g. as little as one to three percent of the polyether triol. The preferred diisocyanate is toluene diisocyanate (TDI) although other relatively low molecular weight diisocyanates of the general formula:

$$(O=C=N)_2R \qquad (I)$$

wherein R is a $C_{2\text{-}20}$alkylene, alkenylene or cycloalkylene radical or a $C_{6\text{-}40}$arylene, alkarylene or aralkylene are useful.

The polyether diol/polyether triol blend is reacted with excess diisocyanate. Generally the equivalent weight reaction ratio of the polyether diol/polyether triol blend to diisocyanate will be in the range of about 1.0 equivalent weights of polyether diol/polyether triol to about 1.6 to about 2.2 equivalent weight of diisocyanate. The preferred reaction ratio is 1.0 equivalents of the polyether diol/polyether triol blend for every 2.0 equivalents of diisocyanate. This preferred reaction ratio is particularly important to the properties of the final composition. The 2:1 ratio yields a final product with a chemical structure having a high degree of chemical, solvent and hydrolytic resistance.

At present the preferred prepolymer is based on a mixture of 0.916 equivalents of polyether diol (m.w. 1000 average) and 0.084 equivalents of polyether triol (m.w. 700 average) reacted with 2.0 equivalents of diphenylmethane diisocyanate (MDI). The resin resulting is then blended with an acrylate or methacrylate reactive diluent such as are exemplified by, but not limited to trimethylol propane ethoxylate triacrylate, dicyclopentadiene methacrylate and dicyclopentadiene acrylate. Other reactive methacrylate compounds such as isobutyl methacrylate, isobornyl methacrylate, lauryl methacrylate and cyclohexomethacrylate also can be beneficially utilized. The reaction preferably is accomplished in the absence of other i.e. non-reactive diluents.

The isocyanate-capped prepolymers typically comprise about 50 to about 75% by weight of the reaction mixture, and preferably will comprise about 65% by weight, while the acrylate or methacrylate reactant diluent typically will comprise about 25 to about 50% by weight of the reaction mixture, and preferably will comprise about 35% by weight.

The polymerization initiators useful in accordance with the present invention comprise ultra-violet (hereafter "uv") activated free-radical generators and typically may be employed in amounts of about 1% to about 10% by weight of the coating and potting composition. Many uv activated polymerization initiators are known in the art and may be advantageously employed in the invention. For example, the uv activated initiators may be selected from metal carbonyls of the formula $M_x(CO)_y$ wherein M is a metal atom, x is 1 or 2, and y is an integer determined by the total valence of the metal atoms, generally 4 to 10. The preferred uv activated initiators are selected from (a) $C_{1-16}$ straight or branched chain alkyl diones; and (b) carbonyl compounds of the general formula $R^5(CO)R^6$ wherein $R^5$ is a $C_{1-10}$ alkyl, aryl, aralkyl or alkaryl group, and $R^6$ is $R^5$ or hydrogen. In addition, $R^5$ or $R^6$ can contain any substituents which do not adversely affect the compound in serving its function. For example, $R^5$ or $R^6$ can be alpha-substituted with an alkyl, aryl, alkaryl, alkoxy or aryloxy radical, or with an amino or a mono- or dialkylamino derivative thereof, each of the above substituents containing up to about six carbon atoms. In addition, $R^5$ and $R^6$ taken together with carbonyl group form an aromatic or heterocyclic ketone containing up to about 16 carbon atoms.

It is useful, but not required to incorporate an adhesion promoter into the coating and potting system. The adhesion promoters may be chosen from any of those commonly known to the person reasonably skilled in the art. Two types of promoters are preferred. The first type consists of mono- and dicarboxylic acids which are capable of copolymerizing with the acrylate or methacrylate reactive diluent. The preferred species of these classes are methacrylic and acrylic acid. Such acids are used in proportions of 1–20% by weight of coating and potting system, preferable in proportion of 1–15%. The second preferred type of adhesion promoter is of the well-known silane type, present in the composition in proportions of 1–10% by weight of the coating and potting system.

Also optional, but recommended, are the inclusion of one or more chelators, cross-linking agents and/or polymerization inhibitors. Chelators and inhibitors are effective in amounts of about 0.1 to about 1% by weight of the coating and potting system. Ethylenediamine tetra-acetic acid and its sodium salt (Na₄EDTA), 1,1-ethylenebis-nitril methylidyne dipyridine and the class of beta-diketones are generally the most effective and are preferred. Cross-linking agents, optionally present in amounts from about zero to about 10% by weight of the coating and potting system, include such compounds as copolymerizable dimethyacrylates.

The inhibitor concentration left over in the monomers from manufacture is often high enough for good stability. However, to insure maximum shelf life, the proportions mentioned above (about 0.1 to about 1% by weight of the coating and potting system) are recommended. Of those inhibitors which have been found of adequate utility is the group consisting of hydroquinones, benzoquinones, naphthoquinones, phenanthraquinones, anthraquinones, and substituted compounds of any of the foregoing. Additionally, various phenols can be employed as inhibitors, the preferred one being 2,6-tert-butyl-4-methyl phenol.

The amount of thickness, viscosity, or thixotropy desired can be varied in accordance with the particular application required. Thickeners, plasticizers, diluents, and various other reagents common to the art can be employed in any reasonable manner to produce the desired characteristics.

It is also optional, but recommended, that surfactants be present in the coating and potting system for optimum performance. Selection of suitable surfactants is a matter of simple experimentation. Obviously the surfactant must be soluble in the polymer composition and should be non-reactive with the isocyanate-capped prepolymer. The preferred surfactants are anionic materials such as the petroleum sulfonates having the formula:

$$(C_nH_{2n-10}SO_3)_xMe \qquad (VIII)$$

wherein n is more than 20 and Me is a metal of valence x. Such materials are sold by, among others, Witco Chemical Corp., New York, N.Y., under the trademark "Alconate" 80, and by the Penreco Division of Penzoil, Butler, Pa., under the trademark "Petrobase."

Another suitable anionic type comprises the sodium alkyl or alkylaryl sulfonates having the formula:

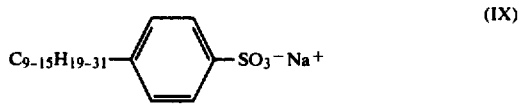

(IX)

Such materials are sold by E.I. duPont de Nemours & Co., Wilmington, Del., under the trademarks "Alkanol" 189-S and "DW" and the trademark "Duponol," and by Union Carbide Corp., New York, N.Y., under the trademark "Tergitol" (numerical series). Still another useful anionic class is the sulfonated ethoxylated types sold as the "Alipal" series by GAF Corp., New York, N.Y., and as "Neodol" 25-35 by Shell Chemical Co., Houston, Tex.

Surfactant concentration will depend in any given case upon the particular surfactant and reactive diluent being used. Optimization will be a matter of routine experimentation within the skill of the art. Ordinarily, however, minimum concentration of about 0.25 percent surfactant by weight of the coating and potting system will be needed to achieve an acceptable degree of emulsifiability, and a concentration of at least about 0.5 percent usually will be preferred. The maximum surfactant concentration will usually be about ten percent since above this level the surfactant may begin to interfere with the properties of the coating and potting system by adversely affecting, for example, its cure rate, stability or the cured products. As a practical matter, an upper concentration limit of about five percent, is usually satisfactory. For most surfactants or combinations of surfactants, the optimum concentration will probably fall in the range of about 1.0 to 2.5 percent by weight of the total coating and potting system.

The coating and potting system of the present invention is designed primarily as a uv curing product; however, due to the configuration of many circuit boards and electrical and electronic components there are shadow areas that cannot be cured by uv light. To overcome this deficiency, a second curing mechanism has been built into the coating and potting system. More specifically, after exposure to uv a built-in moisture cure mechanism is available to complete curing of uncured areas of the coating and potting. The overall curing mechanisms are as follows:

(1) uv light polymerizes the acrylate or methacrylate species to provide fixture of the coating; and (2) The isocyanate-capped prepolymer then reacts with water, specifically atmospheric moisture, i.e. according to the following formula.

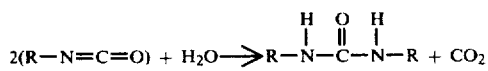

This latter reaction provides ultimate physical properties and complete cure to the substrate.

EXAMPLE I

The invention will now be illustrated by the following description of a specific preferred embodiment thereof, given by way of example only. To a nitrogen-swept, four-necked resin kettle equipped with a stainless steel stirrer, nitrogen inlet tube, thermometer, condensor, and entrance port, add 286 grams of Upjohn LF-168 diphenylmethane diisocyanate (MDI). Then slowly add at 60° with mixing 466 grams of polyether diol (100 m.w. average) and 20 grams of polyether triol (700 m.w. average). Heat to 60° C. with mixing for one hour and then at 90° C. for one and one half hours. Cool to room temperature, add 260 grams of trimethylol propane ethoxylate triacrylate and 30 grams of Ciba-Geigy Irgacure 651 dimethoxy-2-phenyl acetophenone, and blend.

The resulting blend was applied by dipping the back side surface of an audio speaker cone. Cure of the coating was effected by exposing the speaker to uv radiation (3650 angstroms, 60,000 microwatts per square centimeter) for 20 seconds. Those areas of the coating exposed to uv radiation were solid and dry to the touch within 25 to 45 seconds. Shadow areas of the speaker core, i.e. not receiving direct uv radiation, were wet to the touch initially, but were found to be fully cured after standing at ambient temperature and humidity conditions for twenty-four hours. The speaker core was sliced through shadow areas, and the coating was found to be fully cured to the board surface after twenty-four hours.

The coating was humidity tested as follows: The coated speaker cone was placed on a rack in a stainless steel tank, and 500 grams of water added to the bottom of the tank. The tank was closed, sealed, and heated to a temperature of 115° C. After heating for 40 hours, the tank was allowed to cool. The tank was then opened, and the cone removed and examined. No visible blistering or other evidence of coating failure was observed.

EXAMPLE II

The procedure of Example I was repeated except 260 grams of dicyclopentenyl methacrylate was employed in place of the trimethylol propane ethoxylate triacrylate. Similar results to Example I were obtained.

EXAMPLE III

The procedure of Example II was repeated except 260 grams of dicyclopentadiene acrylate was employed in place of the trimethylol propane ethoxylate triacrylate. Similar results to Example I were obtained.

As will be appreciated the foregoing invention provides novel and improved coating systems for conformal coating and potting printing circuit boards and electrical and electronic components and the like. The coating and potting systems may be applied to the circuit board substrates or components by any convenient manner, for instance, by brushing, dripping, rolling, dipping, etc. or by spraying (when suitably diluted). Moreover, the coating and potting systems cure through dual mechanisms including uv cure which permits fast fixture cure thereby achieving almost immediate dry-to-the-touch curing. However, unlike conventional uv cured products, the coating and potting systems of the present invention do not require full area irradiation to achieve full cure due to their built-in secondary cure mechanism. Moreover, the cured coatings and pottings have excellent adherence to plastics, metal, glass and wood, good abrasion resistance, and are hydrolytically stable and resistant to thermal cycling. The coating and pottings also are repairable, i.e., can be removed by selective solvents such as methyl ethyl ketone, and then replaced by brush or spray, and uv cured.

The invention has been described particularly with application to potting audio speaker cores. However, one skilled in the art would appreciate that the coating and potting systems may be applied to other electrical electronic components such as printed circuit board assemblies, electrical transformers or the like. Moreover, the coating and potting system is not limited to the use in the electronics field but may be employed in any industrial area where conformal protective coating and/or potting is desired.

I claim:

1. A one-part coating composition, especially useful for conformal coating and potting, comprising:
   (1) At least one isocyanate-capped polyether diol and triol;
   (2) An acrylate or methacrylate reactive diluent; and
   (3) A polymerization initiator of the photo-initiator type.

2. The coating and potting composition of claim 1, wherein said isocyanate-capped polyether diol and triol comprises the reaction product of a blend of at least one polyether diol and at least one polyether triol with excess diisocyanate.

3. The coating and potting composition of claim 2, where the polyether diol portion comprises a polyether diol of molecular weight in the range of about 300 to about 5,000 average.

4. The coating composition of claim 2, wherein the polyether triol portion comprises a polyether triol of molecular weight in the range of about 200 to about 3,000 average.

5. The coating and potting composition of claim 2, where said polyether diol has a molecular weight of about 400 to about 1,000 average, and said polyether triol has a molecular weight of about 700 average.

6. The coating and potting composition of claim 2, where said polyether diol and polyether triol blend comprises said polyether diol in major proportion.

7. The coating and potting composition of claim 2, where said isocyanate-capped polyether diol and triol comprises the reaction product about 1.0 equivalents of said polyether diol and polyether triol blend with about 1.6 to about 2.2 equivalents of diisocyanate.

8. The coating and potting composition of claim 6, and comprising about 1.0 equivalents of said polyether diol and polyether triol blend with about 2.0 equivalents of diisocyanate.

9. The coating and potting composition of claim 8, and comprising about 0.916 equivalents of polyether diol of molecular weight of about 400 to about 1000 average, 0.084 equivalents of a polyether triol of molecular weight of about 700 average, and 2.0 equivalents of diphenyl methane diisocyanate.

10. The coating and potting composition of claim 2, wherein said acrylate or methacrylate reactive diluent is selected from the group consisting of trimethylol propane ethoxylate triacrylate, dicyclopentadiene methacrylate, dicyclopentadiene acrylate, isobutyl methacrylate, isobornyl methacrylate, lauryl methacrylate and cyclohexylmethacrylate.

11. The coating and potting composition of claim 2, and further comprising an anionic surfactant.

12. A coating composition of claim 2, wherein said acrylate or methacrylate reactive diluent comprises about 25 to about 50% by weight of said coating composition.

13. A coating composition of claim 12, wherein said acrylate or methacrylate reactive diluent comprises about 35% by weight of said coating composition.

14. A method of forming a uv curing polymerizable conformal coating or potting on a substrate wherein said substrate has one or more shadow areas, comprising the steps in sequence of:
   (1) providing a polymerizable coating composition which comprises at least one isocyanate-capped polyether diol and triol, an acrylate or methacrylate reactive diluent, and a polymerization initiator of the photo-initiator part;
   (2) applying said coating composition to said substrate;
   (3) exposing the coated substrate to uv light of wave length and intensity to effect uv cure of exposed areas of said coating; and
   (4) storing said coated substrate under conditions of temperature and humidity such as to promote curing of unexposed (shadow) areas of said coating through a built-in secondary cure mechanism.

15. A method according to claim 14, wherein said substrate comprises a circuit board having one or more components mounted thereon.

16. A method according to claim 14, wherein said substrate comprises an electrical or electronic component.

17. A printed circuit board having one or more components mounted thereon, and covered at least in part with the cured coating composition of claim 1.

18. An electrical or electronic component covered at least in part with the cured coating of claim 1.

* * * * *